Oct. 29, 1968 M. C. HORTON ET AL 3,408,599
DISTRIBUTED CONSTANT FILTER CIRCUITS COMPRISING AN ARRAY OF COUPLED, PARALLEL, CONDUCTIVE BARS
Filed Nov. 14, 1966
2 Sheets-Sheet 1

INVENTORS.
Milford C. Horton
Robert J. Wenzel
BY
Richard J. Seeger
ATTORNEY.

INVENTORS.
Milford C. Horton
Robert J. Wenzel
BY
Richard J. Seeger
ATTORNEY

United States Patent Office 3,408,599

Patented Oct. 29, 1968

3,408,599

DISTRIBUTED CONSTANT FILTER CIRCUITS COMPRISING AN ARRAY OF COUPLED, PARALLEL, CONDUCTIVE BARS

Milford C. Horton, Birmingham, and Robert J. Wenzel, Hazel Park, Mich., assignors to The Bendix Corporation, a corporation of Delaware Filed Nov. 14, 1966, Ser. No. 594,245
17 Claims. (Cl. 333—73)

ABSTRACT OF THE DISCLOSURE

A strip line microwave filter for passing or stopping a prescribed band of frequencies, comprising an array of parallel, conductive bars coupled along their length and to a ground potential plane, with internal line elements disposed in the bars.

This invention pertains to distributed constant filters having wide band characteristics, having low VSWR in the pass band, high attenuation in the stop band, and equal ripple in the pass and stop bands which provides very fast transition times between the pass and stop bands.

While it is known in the art to provide distributed constant capacitances and distributed constant inductances and it is known to provide an array of shunt-and-series distributed constant capacitances and an array of shunt-and-series distributed constant inductances, it has not been possible prior to this invention to combine distributed constant capacitances and inductances to form a distributed constant filter having the superior characteristics of the filter of this invention. As is well known by those skilled in the art, distributed constant circuits are significantly more difficult to build than are lumped constant circuits. Distributed constant impedances are necessary when the input signal frequencies become so high that their wavelengths approach the length of conventional lumped constant impedance members such as inductors and capacitors and these members may no longer be considered lumped at a point relative to the input signal wavelength.

It is therefore an object of this invention to provide a distributed constant filter circuit having wide band characteristics, low VSWR in the pass band, high attenuation in the stop band and equal ripple in the pass and stop bands.

It is an object of this invention to accomplish these characteristics by providing an array of conductive elements parallel to one another to form the shunt-and-series impedance portion of the filter circuit, spacing these elements along their length from a ground plane or ground planes, forming openings through the elements for insertion of impedance lines to form the bridging-series impedance portion of the circuit, connecting the impedance lies at one end to adjacent elements.

It is an object to provide a band pass filter circuit by forming a shunt-and-series inductance circuit of the kind in the previous object by shorting the conductive elements to the ground plane at the other end, opposite to the one end where the bridging-series lines are connected to adjacent elements, and to provide bridging-series capacitances in the distributed constant filter circuit by inuslating each bridging-series impedance line along its entire length within a conductor element.

It is an object to provide a band stop filter circuit by forming a shunt-and-series capacitance array by insulating the conductive elements from the ground planes along their entire length and to provide bridging-series inductances in the distributed constant filter circuit by shorting the bridging-series impedance lines at the other end of the filter circuit which is opposite to the one end where the lines are connected to adjacent elements.

It is an object to form the shunt-and-series array elements and bridging-series lines in the array elements one quarter wavelength of the frequency which is substantially in the center of the filter circuit bandwidth.

It is an object of this invention to form the above filter circuit with the spacing between the parallel conductive elements, the spacing between the ground plane and parallel conductive elements in the array and with the cross-sectional dimension of the array elements being related to the shunt-and-series inductance or capacitance distributed constant impedance values in the filter circuit; and with the ratio of the diameter of the opening in the array elements to the cross-sectional diameter of the lines in the array elements being related to the bridging-series capacitive or inductive distributed constant impedance values in the filter circuit.

Figures 1, 1A, 1B, 2, 2A, 2B:
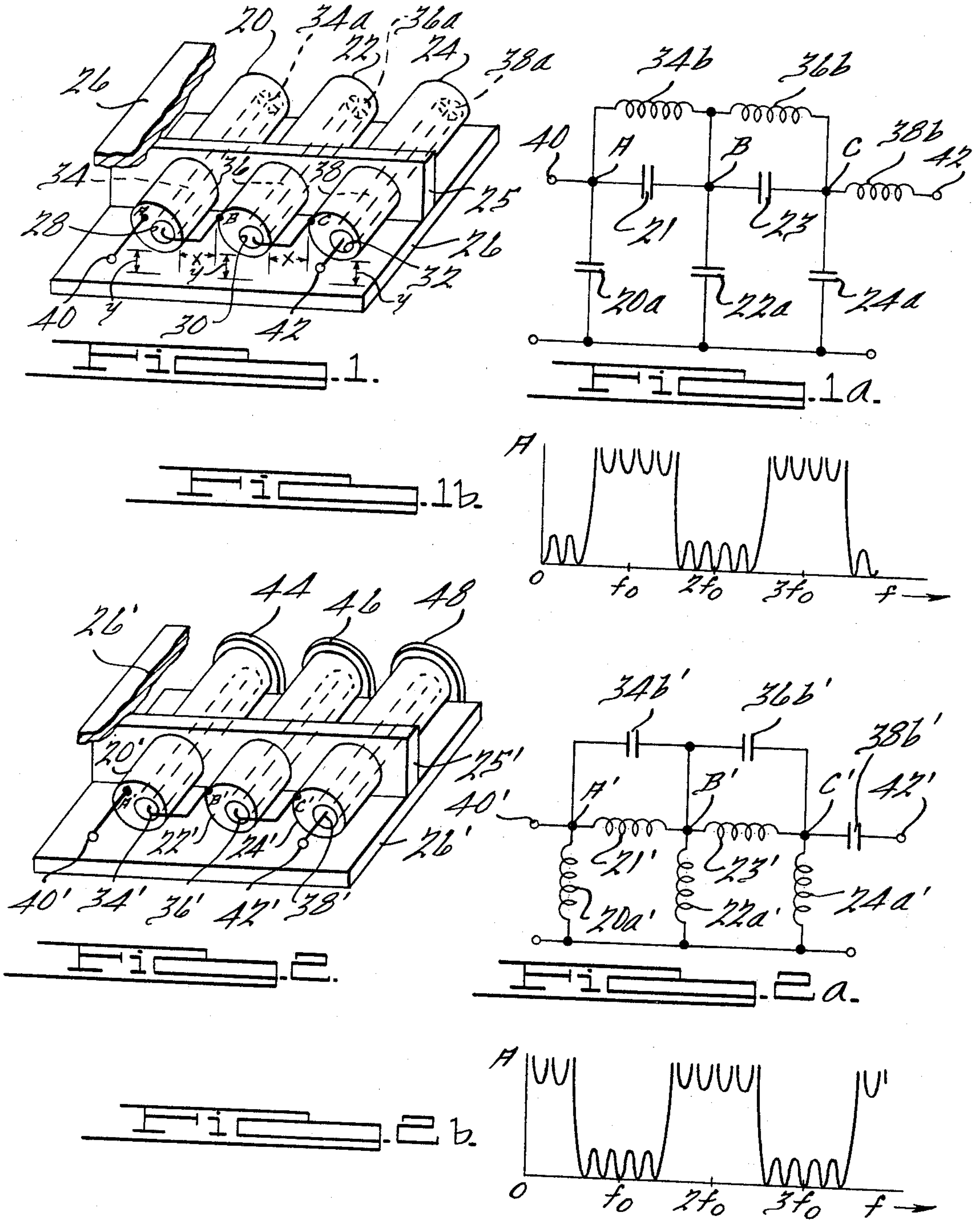
Figure 3:
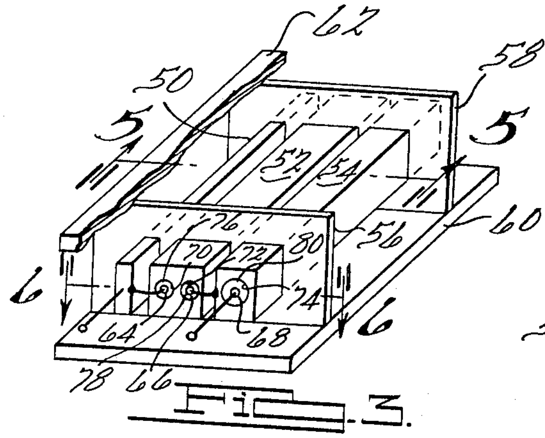
FIGURE 3 is a schematic, partial, perspective view of a distributed constant band stop filter circuit of this invention.

These and other objects and advantages will become more apparent when preferred embodiments of this invention are explained in connection with the drawings in which:

FIGURE 1 is a schematic, perspective view of a preferred embodiment of this invention showing a distributed constant band stop circuit;

FIGURE 1*a* is the lumped constant prototype circuit for the circuit of FIGURE 1;

FIGURE 1*b* is a schematic showing of the pass and stop bands of the circuit of FIGURE 1;

FIGURE 2 is a schematic, perspective view of a distributed constant band pass circuit;

FIGURE 2*a* is a schematic drawing of the lumped constant prototype band pass circuit of FIGURE 2;

FIGURE 2*b* is a schematic showing of the band pass characteristics of the circuit in FIGURE 2;

*Embodiment of FIGURE 1*

The general principles of this invention will now be discussed in connection with FIGURES 1, 1*a* and 1*b*, and FIGURES 2, 2*a* and 2*b*. Shown in FIGURE 1 are conductive elements 20, 22, 24 which are parallel to one another and separated from one another by a distance in the *x* direction to form an array. Elements 20, 22, 24 are all spaced by insulative support 25 a distance in the *y* direction from ground plane 26. The distances in the *x* and *y* directions may vary between individual elements in the same array and relate to the shunt-and-series impedances of the filter circuit.

Located in conductive elements 20, 22, 24 are longitudinal openings 28, 30 and 32 respectively, and entering one end of openings 28, 30 and 32 are impedance lines 34, 36 and 38 respectively which are insulated along their length from elements 20, 22 and 24 but are shorted, or electrically connected, to elements 20, 22 and 24 at their end at points **34*a*, 36*a* and 38*a* respectively. Elements 20, 22 and 24 and lines 34, 36 and 38** are made of an electrically conductive material.

Input 40 is connected at point A to element 20, line 34 is connected to element 22 at point B, line 36 is connected to element 24 at point C, and output 42 is connected to the one end of line 38. The spacing between the impedance lines 34, 36 and 38 and their respective conductive elements 20, 22 and 24 relate to the bridging-series values of the filter circuit which are shown as inductances 34*b*, 36*b*, 38*b* in the schematic lumped constant prototype circuit of FIGURE 1*a*. Elements 20, 22 and 24 are electromagnetically coupled along their entire length to their respective adjacent elements and elements 20, 22 and 24 and lines 34, 36, 38 are all one quarter wavelength of the frequency $f_0$, shown in FIGURE 1*b*, which is in the center of the first band stop of the filter. The above mentioned distances in the *x* and *y* direction and the cross-sectional dimensions of elements 20, 22 and 24 determine the values of shunt capacitances 20*a*, 22*a* and 24*a*, shown in FIGURE 1*a*, and the value of series capacitances 21 and 23.

The combination thus described for the embodiment for FIGURE 1 provides a distributed constant band stop filter circuit having characteristics of the kind shown in FIGURE 1*b* where attenuation A is plotted along the ordinate and frequency is plotted along the abscissa. A distributed constant band pass filter may be provided by removing the electrical connections 34*a*, 36*a* and 38*a* and providing an electrical connection between the elements 20, 22 and 24 with ground plane 26 at the upper end or end opposite to the connections A, B and C. This type of filter circuit will be next described in connection with FIGURES 2, 2*a* and 2*b*. In FIGURES 1*a* and 2*a*, the ungrounded nodes A, B and C and A', B', C' correspond to conductive members 20, 22, 24 and 20', 22' and 24' respectively. Hence, there are three nodes in each circuit of FIGURES 1*a* and 2*a* and three conductive members shown in FIGURES 1 and 2 respectively.

*Embodiment of FIGURE 2*

The circuit of FIGURE 2 is similar to that in FIGURE 1 and the components thereof have corresponding reference numerals with the reference numerals of FIGURE 2 carrying a prime mark thereafter. There are, however, two major differences between the circuits of FIGURES 1 and 2. The first difference is that in the circuit of FIGURE 2, the elements 20', 22', 24' are shorted or electrically connected at the ends opposite connections A', B', C' to ground plane 26' by shorting bars 44, 46 and 48 respectively. This makes the elements 20', 22', 24' inductive and since these elements relate to the shunt-and-series array components of the band pass filter circuit, a band pass circuit, which is shown in prototype lumped term components in FIGURE 2*a*, results. In this embodiment, the spacing between elements 20', 22' and 24', and ground plane 26', the horizontal spacing between elements 20' and 22' and elements 22' and 24' and the cross-sectional dimensions of elements 20', 22' and 24' determine the value of inductances 21', 23', 20*a*', 22*a*' and 24*a*'.

The second major difference is that lines 34', 36' and 38' are not shorted or electrically connected to elements 20', 22', 24' and therefore these elements act as capacitances in the bridging-series portion of the circuit of FIGURE 2*a*. The spacing between member 34' and element 20' relates to the value of capacitance 34*b*', the spacing between line 36' and element 22' relates to the value of capacitance 36*b*' and the spacing between line 38' and element 24' relates to the value of capacitance 38*b*'. As in FIGURE 1, the elements 20', 22', 24' are electromagnetically coupled along their entire length to adjacent elements and they, along with lines 34', 36', 38' are one quarter wavelength of frequency $f_0$, shown in FIGURE 2*b*, which is the frequency in the middle of the first pass band of the filter. Attenuation is plotted along the ordinate in FIGURE 2*b* while frequency is plotted along the abscissa in FIGURE 2*b*.

*Embodiment of FIGURES 3–6*

A specific band stop distributed constant filter of this invention is shown in FIGURES 3–6 and is generally similar to that shown in FIGURE 1. Elements 50, 52 and 54 are made of a metallic or conductive material, spaced from one another and parallel to one another and supported by insulative supports 56, 58 between ground planes 60, 62. In this embodiment, supports 56, 58 are made of 1/32-inch Teflon fiber glass.

Conductive lines 64, 66 and 68 are supported in openings 70, 72, 74, respectively with openings 70 and 72 being formed in element 52 and opening 74 being formed in element 54. From this embodiment it can be seen that lines 64, 66 can be placed in the same element, if it is large enough, or there can be one line to each element as in FIGURE 1, with a primary consideration being the size of the elements. In this embodiment, there are insulative sheets 76, 78 and 80 (FIGURE 5) for supporting lines 64, 66, 68 respectively to their openings. The material of sleeves 76, 78 and 80 in this embodiment is Teflon plastic. In this embodiment, the elements 50, 52 and 54 and lines 64, 66 and 68 are one quarter wavelength at the center frequency of the first frequency band stop. Lines 64, 66 and 68 are shorter than elements 52 and 54 because the quarter wavelength in Teflon plastic is shorter than it is when the dielectric is air, which surrounds lines 52 and 54.

Adjustable shorting blocks 82, 84 and 86 (FIGURE 6) are inserted respectively in openings 70, 72 and 74 and form an electrical connection between the lines in the openings and the elements in which the openings are formed. Blocks 82, 84 and 86 are movable longitudinally in the openings to adjust the length of the lines in the openings.

Figure 5:
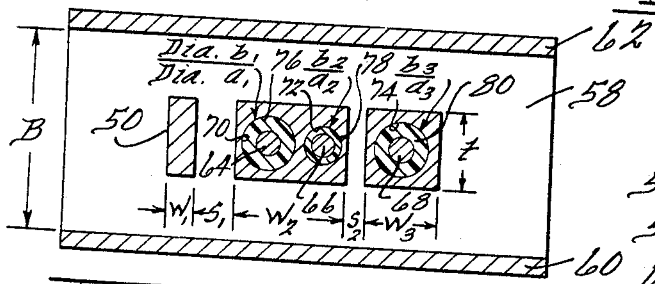
FIGURE 5 is an enlarged section taken at 5—5 of FIGURE 3.
Figure 6:
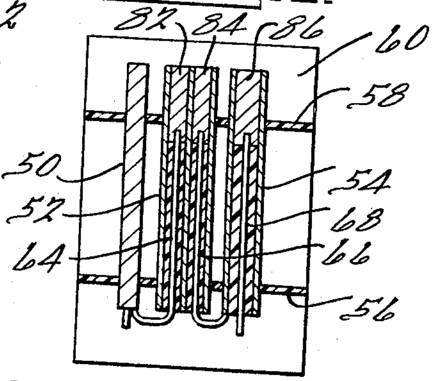
FIGURE 6 is a section taken at 6—6 of FIGURE 3.

In the cross section of FIGURE 5, $b_1$, $b_2$ and $b_3$ are respectively the diameters of openings 70, 72 and 74 while $a_1$, $a_2$ and $a_3$ are respectively the diameters of lines 64, 66, 68. The ratio $b_1/a_1$ is equal to 1.96, $b_2/a_2$ is equal to 1.65, $b_3/a_3$ is equal to 2.18, in this embodiment. $w_1$, $w_2$ and $w_3$ are respectively the horizontal dimensions of the cross section of elements 50, 52 and 54 with $w_1$ equaling .054 inch, $w_2$ equaling .275 inch and $w_3$ equaling .162 inch. The horizontal distance between elements 50 and 52 is equal to $s_1$ which is equal to .107 inch and the horizontal distance between elements 52 and 54 is $s_2$ which is equal to .052 inch in this embodiment. The vertical height of elements 50, 52 and 54 is equal to $t$ and in this embodiment is .200 inch. The distance B between ground planes 60 and 62 is .500 inch and the array of elements 50, 52, 54 is centered vertically between ground planes 60 and 62. The above dimensions are for a specific circuit only and are not intended to be limiting of this invention.

Figure 4:
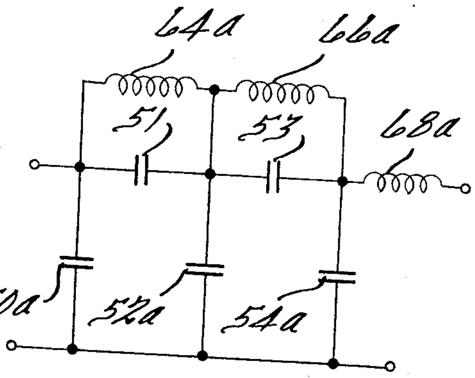
FIGURE 4 is a lumped constant prototype circuit for the band stop circuit of FIGURE 3.

In the design of filters in this invention, the values for the prototype circuits such as illustrated in FIGURES 1*a*, 2*a* and 4 are determined by reference to R. Saal, "Der Entwurf von Filtern mit Hilfe des Kataloges Normierter Tiefpässe" (The Design of Filters Using the Catalog of Normalized Low-Pass Filters), Telefunken, G.m.b.H., Backnang, Wurttemberg, Germany; 1961. This reference gives values for low pass filters of desired characteristics. High pass filters may be determined readily from low pass filter components by using the reciprocals thereof. Once the values "C" from the Saal reference supra are obtained, they may be converted to "static capacitance" values, *c*, of the distributed line in the following manner:

$$c=(\eta/\sqrt{\epsilon_r})C$$

where $\eta=376.7/Z_o$ for a filter terminated in $Z_o$ ohms, and $\epsilon_r$ is the relative dielectric constant of the medium. The static capacitance *c* is then used to determine the spacing and cross-sectional dimensions for the above circuits shown in FIGURES 1, 2 and 3, as will be discussed.

In determining the values of the shunt-and-series array portion of the circuit as indicated by capacitances 50*a*, 52a, 54a, 51 and 53 of the prototype lumped constant circuit elements of FIGURE 4, the ratios $t/B$, $s/B$ and $w/B$ become significant. Tables relating the static capacitances and inductances to the above ratios for design of circuits in accordance with this invention for any desired values may be found in an article by W. J. Getsinger entitled "Coupled Rectangular Bars Between Parallel Plates," IRE Transactions on Microwave Theory and Techniques, vol. MTT-10, pp. 65–72, January 1962. Further information may be found in an article by G. L. Matthaei entitled "Interdigital Band Pass Filters" in IEEE Transactions on Microwave Theory and Techniques, vol. MTT-10, pp. 479, 491, November 1962.

The ratios $b_1/a_1$, $b_2/a_2$ and $b_3/a_3$ are significant in the determination of the values of the bridging-series elements 64a, 66a, 68a, which are the prototype lumped constant values shown in FIGURE 4, for the bridging-series portion of the circuit. The reference The Microwave Engineers' Handbook and Buyers' Guide, Brookline, Mass.: Horizon House-Microwave, Inc., p. 91; 1966, provides graphs for the determination of $b/a$ ratios for given static capacitance or inductance values.

While square or rectangular cross-section elements are shown for elements 50, 52 and 54, these may also be round and the tables in this case may be found in the article "Coupled Circular Cylindrical Rods Between Parallel Ground Planes," IEEE Transactions on Microwave Theory and Techniques, vol. MTT-12, pp. 428–439, July 1964. It should be understood also that any number of sections to the filter circuit may be provided by simply adding elements between the ground planes. While the lines 64, 66 and 68 are shown centered in their respective openings, this may be varied since it is the ratio $b/a$ which is significant. Also, a band pass circuit may be utilized by constructing the elements similar to that shown in FIGURE 2 with a shorting member between the upper ends of elements 50, 52 and 54 and the ground plane. In a band pass circuit, the shorting blocks 80, 82 and 84 would not be utilized.

Figures 7, 8:
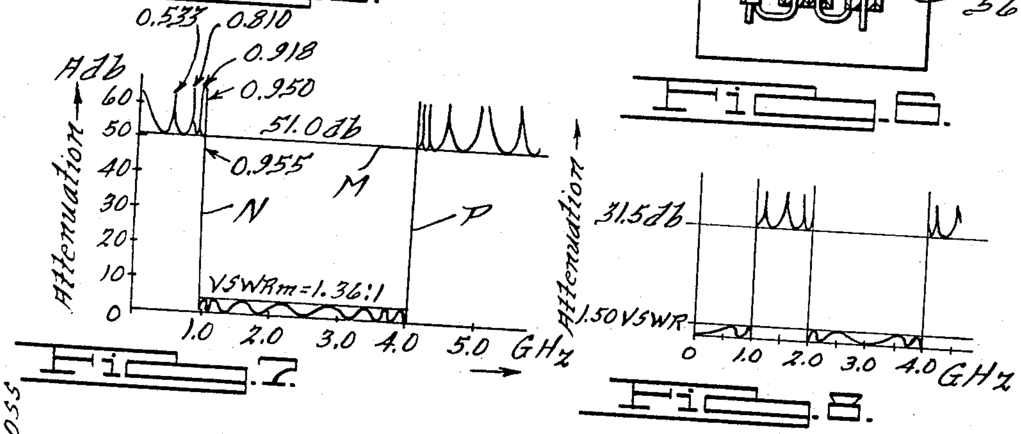
FIGURE 7 is a theoretical curve computed from data for a band pass filter of this invention.
FIGURE 8 is a theoretical curve computed from data for a band stop filter of this invention.
Figure 9:
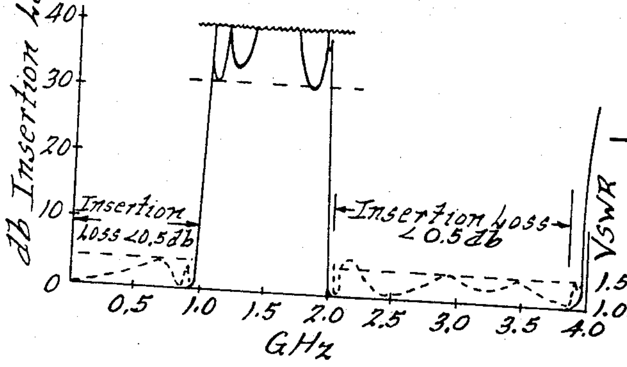
FIGURE 9 is a curve obtained from an actual band stop filter model of this invention.

FIGURE 7 shows a band pass filter theoretical response curve for a device of this invention with attenuation being plotted along the ordinate and frequency being plotted along the abscissa. It should be noted that there is a relatively low VSWR in the pass band, that line M which connects the lower points of the attenuation curve outside the pass band is at a relatively high level, and that lines N and P are substantially vertical which means a very fast transition between stop and pass conditions. FIGURE 8 is a curve similar to FIGURE 7 but for a band stop filter. FIGURE 9 shows a curve obtained from an actual model of a band stop filter.

Although this invention has been disclosed and illustrated with reference to particular applications, the principles involved are susceptible of numerous other applications which will become apparent to persons skilled in the art. The invention is, therefore, to be limited only as indicated by the scope of the appended claims.

Having thus described our invention, we claim:

1. A microwave filter for filtering microwave electrical energy in a microwave electrical circuit comprising:
a reference potential plane, an array of substantially parallel, conductive elements, frequency sensitive means for transferring electrical energy between at least certain of said elements and said plane, means for reactively coupling each of said conductive elements to at least one other of said conductive elements, at least one of said conductive elements having at least one longitudinal opening therein, an internal line element disposed within said longitudinal opening, and means for electrically connecting said internal line element to another one of said conductive elements of said array.

2. The combination of claim 1 in which each of said conductive elements is reactively coupled along substantially the entire length thereof to at least one other of said conductive elements.

3. The combination of claim 1 in which said internal line element is electrically insulated along its entire length from said at least one of said conductive elements.

4. The combination of claim 1 in which said frequency sensitive means for transferring electrical energy comprises direct electrical conduction means of preselected inductance.

5. The combination of claim 3 in which said frequency sensitive means for transferring electrical energy comprises direct electrical connection means of preselected inductance.

6. The combination of claim 5 in which said reactive coupling comprises a preselected inductive coupling.

7. The combination of claim 1 further including an inductance, including said internal line element and said at least one of said conductive elements.

8. The combination of claim 1 further including a direct electrical connection at a preselected point between said internal line element and said at least one of said conductive elements.

9. The combination of claim 1 in which said frequency sensitive means for transferring electrical energy comprises preselected electromagnetic, capacitative coupling.

10. The combination of claim 8 in which said frequency sensitive means for transferring electrical energy comprises preselected electromagnetic, capacitative coupling.

11. The combination of claim 10 in which said reactive coupling comprises a preselected capacitative coupling.

12. The combination of claim 1 in which said internal line element and said at least one conductive member have an effective electrical length of one-quarter wave length at the midband frequency of the filter.

13. The combination of claim 1 further including a dielectric surrounding at least a portion of said internal line element to give said internal line element a preselected electrical length at the midband frequency of the filter.

14. The combination of claim 1 with frequency sensitive means for transferring electrical energy between each element and said plane.

15. The combination of claim 1 further including a second reference potential plane substantially parallel to said reference potential plane.

16. The combination of claim 1 in which said one of said conductive elements is adjacent to said at least one of said conductive elements.

17. The combination of claim 1 including at least one internal line element disposed in each of at least all but one of said conductive elements, with each of a plurality of said internal line elements being connected to an adjacent conductive element.

References Cited

UNITED STATES PATENTS

| | | | |
|---|---|---|---|
| 2,390,839 | 12/1945 | Kingaman. | |
| 2,769,101 | 10/1956 | Drosd. | |
| 3,197,720 | 7/1965 | Dehn | 333—73 |

HERMAN KARL SAALBACH, *Primary Examiner.*

PAUL L. GENSLER, *Assistant Examiner.*